(12) United States Patent
Oka

(10) Patent No.: US 7,291,867 B2
(45) Date of Patent: Nov. 6, 2007

(54) OPTICAL SEMICONDUCTOR DEVICE, ELECTRONIC DEVICE, AND METHOD FOR PRODUCING OPTICAL SEMICONDUCTOR DEVICE

(75) Inventor: Junji Oka, Osaka (JP)

(73) Assignee: Sharp Kabushiki Kaisha, Osaka-Shi, Osaka (JP)

( * ) Notice: Subject to any disclaimer, the term of this patent is extended or adjusted under 35 U.S.C. 154(b) by 9 days.

(21) Appl. No.: 11/368,457

(22) Filed: Mar. 7, 2006

(65) Prior Publication Data

US 2006/0203872 A1    Sep. 14, 2006

(30) Foreign Application Priority Data

Mar. 9, 2005    (JP)    ............... 2005-065585

(51) Int. Cl.
*H01L 29/22*    (2006.01)
*H01L 33/00*    (2006.01)
*H01L 29/227*   (2006.01)
*H01L 29/24*    (2006.01)

(52) U.S. Cl. ............... 257/99; 257/95; 257/98; 257/100

(58) Field of Classification Search ............... 257/95, 257/98–100
See application file for complete search history.

(56) References Cited

U.S. PATENT DOCUMENTS 6,998,647 B2 *    2/2006    Morimoto et al. ............... 257/99

2002/0094177 A1 *    7/2002    Horio ............... 385/94
2002/0149119 A1 *   10/2002    Kumatani ............... 257/784
2002/0154366 A1 *   10/2002    Horio ............... 359/172
2003/0015718 A1 *    1/2003    Nakanishi et al. ............... 257/81

FOREIGN PATENT DOCUMENTS

| JP | 11026816 A | * | 1/1999 |
| JP | 11040859 A | * | 2/1999 |
| JP | 11-204555 A |   | 7/1999 |
| JP | 2000114583 A | * | 4/2000 |
| JP | 2005077640 A | * | 3/2005 |
| WO | WO 2005064689 A1 | * | 7/2005 |

* cited by examiner

*Primary Examiner*—Ida M. Soward
(74) *Attorney, Agent, or Firm*—Birch, Stewart, Kolasch & Birch, LLP

(57) ABSTRACT

A resin molded portion 5 is provided with a first protruding molded portion 17 that protrudes from a first inclination portion 11 and a second protruding molded portion 18 that protrudes from a second inclination portion 12. The first protruding molded portion 17 and the second protruding molded portion 18 are diced along dicing lines DL in the same manner as a wiring substrate 1 so that a first protruding portion 17b and a second protruding portion 18b are formed on the first inclination portion 11 and the second inclination portion 12, respectively. The first protruding portion 17b and the second protruding portion 18b have flat portions 17s and 18s in the direction perpendicular to the plane surface of the wiring substrate 1.

16 Claims, 10 Drawing Sheets

OPTICAL SEMICONDUCTOR DEVICE, ELECTRONIC DEVICE, AND METHOD FOR PRODUCING OPTICAL SEMICONDUCTOR DEVICE

BACKGROUND OF THE INVENTION

This application claims priority under 35 U.S.C. § 119(a) on Patent Application No. 2005-065585 filed in Japan on Mar. 9, 2005, the entire contents of which are hereby implemented by reference.

The present invention relates to an optical semiconductor device that is resin molded after mounting a light emitting element, an integrated circuit (IC), and a light receiving element on one side of a wiring substrate, further relates to an electronic device that has such an optical semiconductor device mounted thereon, and yet further relates to a method for producing an optical semiconductor device.

A method for producing a semiconductor device in which, after a large number of semiconductor element chips are mounted on one side of a wiring substrate, the semiconductor element chips are resin molded, and the resin molded portions and the wiring substrate are diced to separate individual semiconductor devices has been known (for example, JP H11-204555).

The prior art described in the above-mentioned JP H11-204555, however, has a problem in that application to an optical semiconductor device that has a light emitting element and a light receiving element mounted thereon is difficult since resin molding is performed using a screen printing method, so that, for example, a lens portion cannot be formed.

Therefore, an optical semiconductor device and a method for producing the same as described in FIGS. 6 to 10 are proposed.

FIG. 6 is a plan view of optical semiconductor devices in a state in which light emitting element chips, IC chips, and light receiving element chips have been mounted on one side of a wiring substrate.

Light emitting element chips 2, IC chips 3, and light receiving element chips 4 are mounted on a wiring substrate 1 by die bonding the light emitting element chips 2 for light emission, the IC chips 3 as integrated circuits for signal processing, and the light receiving element chips 4 for light receiving onto one side of the wiring substrate 1 using conductive resin, and by wire bonding respective terminals of the light emitting element chips 2, the IC chips 3, and the light receiving element chips 4 to an appropriately formed pattern using a metal wire or the like (a mounting step).

The wiring substrate 1 has the light emitting element chips 2, the IC chips 3, and the light receiving element chips 4 that correspond, for example, to 6 optical semiconductor devices, which are to be diced and separated into individual optical semiconductor devices in a downstream step, mounted on one of its sides.

FIG. 7 is a plan view of a conventional optical semiconductor device after completing a molding step, showing a state in which resin molded portions are formed by resin molding light emitting element chips, IC chips, and light receiving element chips that have been mounted on one side of a wiring substrate. FIG. 8 is a side view as viewed from the direction of X shown with an arrow mark in FIG. 7.

Resin molded portions 50 are formed by performing resin molding using translucent resin with an appropriate mold that consists of rectangular parallelepipeds as a basic shape (molding step). In order to facilitate releasing of the mold after the resin molding, the resin molded portions 50 have first inclination portions 51, second inclination portions 52, third inclination portions 53, and fourth inclination portions 54 formed thereon so that they correspond to the wall surfaces of the rectangular parallelepipeds. The first inclination portions 51 are formed so that they have an appropriate angle relative to the direction perpendicular to the plane surface of the wiring substrate 1, and the second inclination portions 52 are formed opposite to the first inclination portions 51 at an angle, as with the first inclination portions 51, relative to the direction perpendicular to the plane surface of the wiring substrate 1. The third inclination portions 53 and the fourth inclination portions 54 are formed on the other wall surfaces in a manner similar to the first inclination portions 51 and the second inclination portions 52.

The resin molded portions 50 are provided with plane surface portions 55 that have a surface that is in parallel with the plane surface of the wiring substrate, and have lens portions 56 and 56 that correspond to the light emitting element chips 2 and the light receiving element chips 4 formed on a part of the plane surface portions 55.

After performing resin molding, the wiring substrate 1 is diced along the dicing lines DL to be separated into individual optical semiconductor devices that have built-in light emitting and light receiving features (separating step).

FIG. 9A is an explanation drawing that describes an individual optical semiconductor device, showing a plan view of the optical semiconductor device as viewed from the side with the lens portions. FIG. 9B is an explanation drawing that describes an individual optical semiconductor device, showing a side view as viewed from the direction of X shown with an arrow mark in FIG. 9A.

Since the wiring substrate 1 is diced perpendicular to the plane surface along the dicing lines DL, the wiring substrate 1 has a substrate end portion 100 that is perpendicular to the plane surface of the wiring substrate 1 adjacent to the first inclination portion 51 as well as a substrate end portion 101 that is perpendicular to the plane surface of the wiring substrate 1 adjacent to the second inclination portion 52.

In addition, since the optical semiconductor device is implemented in a device substrate 59 with the lens portions 56 facing in the lateral direction (see FIG. 10), the substrate end portion (mounting surface) 101 on the side with the second inclination portion 52, for example, has a terminal (not shown) that has been led through and placed for connection to the outside (for example, device substrate 59).

FIG. 10A is an explanation drawing that describes a state in which an optical semiconductor device is implemented in a device substrate of an electronic device, showing a front view of the optical semiconductor device as viewed from the side with the lens portions. FIG. 10B is a side view as viewed from the direction of X shown with an arrow mark in FIG. 10A.

The device substrate 59 of the electronic device has an appropriate wiring pattern (not shown) formed thereon, and the optical semiconductor device is implemented in the device substrate 59 by connecting the terminal of the substrate end portion 101 to the wiring pattern. More specifically, the substrate end portion (attraction surface) 100, which is located opposite to the substrate end portion 101 that has a terminal formed thereon, is attracted with a vacuum nozzle so that the substrate end portion 101 is aligned with and positioned to the wiring pattern of the device substrate 59. However, there is a problem in that it is difficult to achieve stable attraction and alignment since the area of the substrate end portion 100 as the area for attraction with a vacuum nozzle is limited due to a small thickness of the wiring substrate 1.

In addition, in order to prevent malfunction of the IC chip 3 caused by optical and electromagnetic noises, a shield case 60 may be installed. Since the shield case 60 is fixed by adhering it to the substrate end portion 100, a condition where the area of the substrate end portion 100 as the contact area is small causes unstable contact (adherence), which creates a problem in that an accurate directional pattern cannot be obtained if, for example, adhesion is made at an angle along the first inclination 51, causing a deviation in optical axes between the light emitting portion (light emitting element chip 2) and the light receiving portion (light receiving device chip 4) in the implemented state.

In addition, since the substrate end portion 101 needs to be in contact in parallel with the device substrate 59, the substrate end portion 101 needs to be parallel to the device substrate 59. However, since the wiring substrate 1 has a small thickness, the area of the substrate end portion 101 as a mounting area is limited, causing a problem in that the substrate end portion 101 cannot be brought into contact with the device substrate 59 in a stable manner.

SUMMARY OF THE INVENTION

The present invention is carried out in view of the above-described problems, and has an object of providing an optical semiconductor device that can be reliably positioned relative to a device substrate by, after mounting a light emitting element chip, an IC chip, and a light receiving element chip on one side of a wiring substrate, performing resin molding at a resin molded portion that has been provided with a first inclination portion inclined relative to a direction perpendicular to the plane surface of the wiring substrate as well as a second inclination portion located opposite to the first inclination portion so that the first inclination portion is provided with a first protruding portion that has a flat portion that, together with a substrate end portion, constitutes an attraction surface in order to enlarge the substantial attraction surface to stabilize attraction at the time of implementation of the optical semiconductor device.

In addition, the present invention has another object of providing an optical semiconductor device that has accurate directional patterns of a light receiving portion (light receiving element chip) as well as of a light emitting portion (light emitting element chip) by performing resin molding at a resin molded portion that has been provided with a first inclination portion inclined relative to a direction perpendicular to the plane surface of a wiring substrate as well as a second inclination portion located opposite to the first inclination portion and providing the first inclination portion with a first protruding portion that has a flat portion that, together with a substrate end portion, constitutes an attraction surface to bring a shield case in contact with the flat portion so that the shield case is adhered to the substrate end portion in a stable manner while preventing tilting of the shield case.

In addition, the present invention has yet another object of providing an optical semiconductor device that can be securely positioned and connected to a device substrate by performing resin molding at a resin molded portion that has been provided with a first inclination portion inclined relative to a direction perpendicular to the plane surface of a wiring substrate as well as a second inclination portion located opposite to the first inclination portion and providing the second inclination portion with a second protruding portion that has a flat portion that, together with a substrate end portion, constitutes a mounting surface so that the substantial mounting surface is enlarged to stabilize contact at the time of implementation of the optical semiconductor device and to secure the parallelism relative to the device substrate.

In addition, the present invention has yet another object of providing an optical semiconductor device that has a stable and accurate directional pattern by performing resin molding at a resin molded portion that has been provided with a first inclination portion inclined relative to a direction perpendicular to the plane surface of a wiring substrate as well as a second inclination portion located opposite to the first inclination portion and providing a shield case that has a contact portion for contact to the first inclination portion and that is adhered to a substrate end portion so that the shield case can be securely adhered.

In addition, the present invention has yet another object of providing an electronic device that has a stable and accurate directional pattern without defective placement (defective connection) by mounting an optical semiconductor device according to the present invention to an electronic device.

In addition, the present invention has yet another object of providing a method for producing an optical semiconductor device that can substantially enlarge an attraction surface (surface for contact with a shield case) and a mounting surface without adding a manufacturing step by forming a first protruding portion and a second protruding portion that have a flat portion in a direction perpendicular to a wiring substrate at a first inclination portion and a second inclination portion, respectively.

For achieving the above-described objects, an optical semiconductor device according to the present invention is an optical semiconductor device comprising a wiring substrate that has a light emitting element chip, an IC chip, and a light receiving element chip mounted on one of its sides, and a resin molded portion that has a first inclination portion inclined relative to a direction perpendicular to a plane surface of the wiring substrate and a second inclination portion located opposite to the first inclination portion, be formed through resin molding of the light emitting element chip, the IC chip, and the light receiving element chip, wherein the first inclination portion is provided with a first protruding portion that has a flat portion in the perpendicular direction that, together with a substrate end portion of the wiring substrate, constitutes an attraction surface.

This configuration, in which a first protruding portion that has a flat portion in a direction perpendicular to a wiring substrate is provided to a first inclination portion so that the area for attraction with a vacuum nozzle is substantially enlarged, which stabilizes attraction of an optical semiconductor device at the time of implementation of the optical semiconductor device in a device substrate, makes it possible to achieve a secure positioning relative to a device substrate.

In an optical semiconductor device according to the present invention, a shield case is brought into contact with the flat portion.

This configuration, in which a flat portion, together with a substrate end portion, can be used as an area for contact with a shield case so that the shield case can be adhered in a stable manner, makes it possible to obtain a stable and accurate directional pattern.

In an optical semiconductor device according to the present invention, the shield case has a contact portion for contact with the first inclination portion.

This configuration, in which a shield case is supported with a contact portion relative to a first inclination portion so that the shield case can be securely adhered to a substrate portion, makes it possible to obtain a stable and accurate directional pattern.

In an optical semiconductor device according to the present invention that is an optical semiconductor device, comprising a wiring substrate that has a light emitting element chip, an IC chip, and a light receiving element chip mounted on one of its sides, and a resin molded portion that has a first inclination portion inclined relative to a direction perpendicular to a plane surface of the wiring substrate and a second inclination portion located opposite to the first inclination portion, be formed through resin molding of the light emitting element chip, the IC chip, and the light receiving element chip, the second inclination portion is provided with a second protruding portion that has a flat portion in the perpendicular direction that, together with a substrate end portion of the wiring substrate, constitutes a mounting surface.

This configuration, in which a second inclination portion is provided with a second protruding portion that has a flat portion in a direction perpendicular to a wiring substrate so that a mounting area is substantially enlarged, which makes it possible to secure parallelism of a substrate end portion (mounting surface) that has a terminal for connection to a device substrate formed thereon relative to a device substrate, makes it possible to bring an optical semiconductor device in contact with the device substrate in a stable manner, and thus to achieve a stable connection to the device substrate.

In an optical semiconductor device according to the present invention that is an optical semiconductor device, comprising a wiring substrate that has a light emitting element chip, an IC chip, and a light receiving element chip mounted on one of its sides, and a resin molded portion that has a first inclination portion inclined relative to a direction perpendicular to a plane surface of the wiring substrate and a second inclination portion located opposite to the first inclination portion, be formed through resin molding of the light emitting element chip, the IC chip, and the light receiving element chip, the first inclination portion is provided with a first protruding portion that has a flat portion in the perpendicular direction that, together with the substrate end portion of the wiring substrate, constitutes an attraction surface, and the second inclination portion is provided with a second protruding portion that has a flat portion in the perpendicular direction that, together with the substrate end portion of the wiring substrate, constitutes a mounting surface.

This configuration, in which a first inclination portion is provided with a first protruding portion that has a flat portion in a direction perpendicular to the wiring substrate so that the area for attraction with a vacuum nozzle is substantially enlarged, makes it possible to stabilize attraction of an optical semiconductor device at the time of implementation of the optical semiconductor device in a device substrate, and to achieve a secure positioning relative to the device substrate. Furthermore, since a second inclination portion is provided with a second protruding portion that has a flat portion in a direction perpendicular to the wiring substrate so that a mounting area is substantially enlarged, parallelism of a substrate end portion (mounting surface) that has a terminal for connection with the device substrate formed thereon relative to a device substrate can be secured, which makes it possible to bring an optical semiconductor device into contact with the device substrate in a stable manner, and thus to achieve a stable connection to the device substrate.

In an optical semiconductor device according to the present invention, a plurality of the second protruding portions are formed.

This configuration, in which a mounting surface is substantially enlarged so that an optical semiconductor device (resin molded portion) is supported with a larger area, makes it possible to securely maintain parallelism and to easily achieve a secure connection.

In an optical semiconductor device according to the present invention that is an optical semiconductor device, comprising a wiring substrate that has a light emitting element chip, an IC chip, and a light receiving element chip mounted on one of its sides, and a resin molded portion that has a first inclination portion inclined relative to a direction perpendicular to a plane surface of the wiring substrate and a second inclination portion located opposite to the first inclination portion, be formed through resin molding of the light emitting element chip, the IC chip, and the light receiving element chip, a shield case that is adhered to the substrate end portion of the wiring substrate and that has a contact portion for contact with the first inclination portion is provided.

This configuration, in which a shield case is supported with a contact portion so that the shield case can be securely adhered to a substrate end portion, makes it possible to obtain a stable and accurate directional pattern.

An electronic device according to the present invention is characterized by that an optical semiconductor device according to the present invention is mounted thereon.

This configuration, in which an optical semiconductor device can be accurately mounted on a device substrate, makes it possible to achieve a highly reliable electronic device without defective placement (defective connection). More specifically, an electronic device that has a stable and accurate directional pattern can be achieved.

A method for producing an optical semiconductor device according to the present invention is a method for producing an optical semiconductor device comprising a mounting step of mounting a light emitting element chip, an IC chip, and a light receiving element chip on one side of a wiring substrate; a molding step of forming a resin molded portion that has a first inclination portion that is inclined relative to a direction perpendicular to a plane surface of the wiring substrate as well as a second inclination portion that is located opposite to the first inclination portion by resin molding the light emitting element chip, the IC chip, and the light receiving element chip; and a separating step of dicing and separating the wiring substrate, wherein, in the molding step, a first protruding molded portion that protrudes from the first inclination portion in a direction crossing the first inclination portion and a second protruding molded portion that protrudes from the second inclination portion in a direction crossing the second inclination portion are formed, and wherein, in the separating step, the first protruding molded portion and the second protruding molded portion are diced so that a first protruding portion that has a flat portion in the perpendicular direction is formed on the first inclination portion and a second protruding portion that has a flat portion in the perpendicular direction is formed on the second inclination portion.

This configuration makes it possible to form a flat portion that constitutes the same plane surface as a substrate end portion of a wiring substrate on a first inclination portion and on a second inclination portion using the same process as the conventional process without increasing the number of the production process, so that an optical semiconductor device in which a secure attraction with a vacuum nozzle and a secure placement on a device substrate can be achieved and a shield case is adhered in a secure manner can be produced.

According to the optical semiconductor device according to the present invention, resin molding is performed at a resin molded portion that has been provided with a first inclination portion inclined relative to a direction perpendicular to the plane surface of the wiring substrate as well as a second inclination portion located opposite to the first inclination portion, and the first inclination portion is provided with a first protruding portion that has a flat portion that, together with a substrate end portion, constitutes an attraction surface, and therefore the effect of enlarging substantial attraction surface (area for attraction with a vacuum nozzle), of stabilizing attraction at the time of implementation of the optical semiconductor device in a device substrate, and of securely achieving positioning relative to the device substrate can be brought about.

According to the optical semiconductor device according to the present invention, resin molding is performed at a resin molded portion that has been provided with a first inclination portion inclined relative to a direction perpendicular to the plane surface of the wiring substrate as well as a second inclination portion located opposite to the first inclination portion, the first inclination portion is provided with a first protruding portion that has a flat portion that, together with a substrate end portion, constitutes an attraction surface, and a shield case is brought into contact with the flat portion, and therefore the effect of preventing tilting of the shield case through adherence of the shield case to a substrate end portion in a stable manner, and of obtaining a stable and accurate directional pattern can be brought about.

According to the optical semiconductor device according to the present invention, resin molding is performed at a resin molded portion that has been provided with a first inclination portion inclined relative to the direction perpendicular to the plane surface of the wiring substrate as well as a second inclination portion located opposite to the first inclination portion, the second inclination portion is provided with a second protruding portion that has a flat portion that, together with a substrate end portion, constitutes an attraction surface, and therefore the effect of enlarging the substantial mounting surface (mounting area), of securing parallelism relative to a device substrate through stabilization of contact at the time of implementation of the optical semiconductor device in a device substrate, and of securely achieving positioning and connection to the device substrate can be brought about.

According to the optical semiconductor device according to the present invention, resin molding is performed at a resin molded portion that has been provided with a first inclination portion inclined relative to a direction perpendicular to the plane surface of the wiring substrate as well as a second inclination portion located opposite to the first inclination portion, and a shield case having a contact portion that is adhered to a substrate end portion and brought into contact with the first inclination portion is provided, and therefore the effect of adhering the shield case in a secure manner, and of obtaining a stable and accurate directional pattern can be brought about.

According to the electronic device according to the present invention, since an optical semiconductor device according to the present invention is mounted, the effect of eliminating defective placement (defective connection), of achieving a stable and accurate directional pattern and shielding effect, and of achieving a high reliability can be brought about.

According to the method for producing an optical semiconductor device according to the present invention, since a first protruding portion and a second protruding portion that have a flat portion in a direction perpendicular to a wiring substrate are formed on a first inclination portion and a second inclination portion, respectively, the effect of substantially enlarging the attachment surface (surface for contact with a shield case) as well as the mounting surface without increasing the number of the production process can be brought about.

DESCRIPTION OF THE PREFERRED EMBODIMENTS

Hereinafter, embodiments of the present invention will be described with reference to the accompanying drawings.

Embodiment 1

Figure 1:
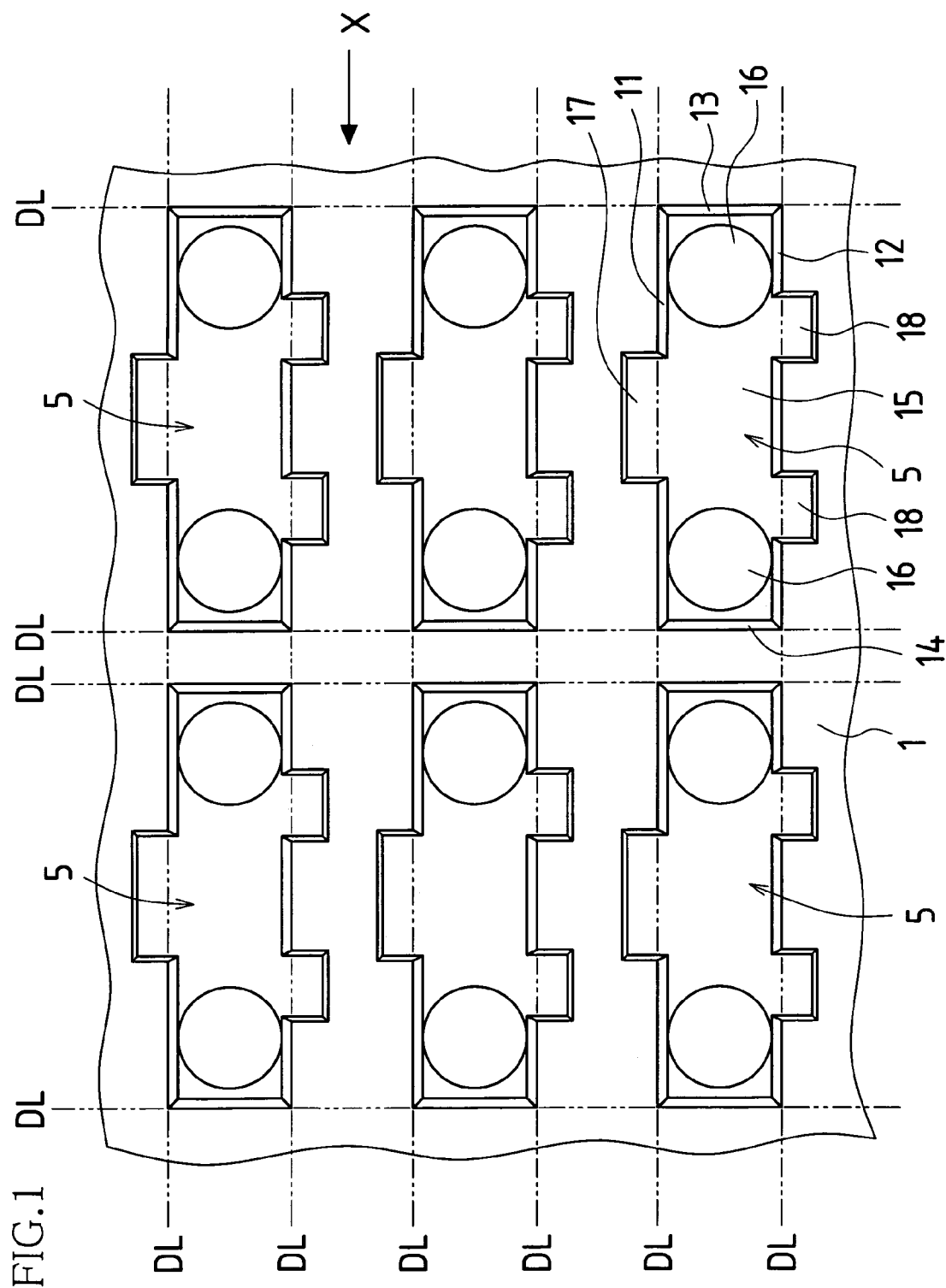
FIG. 1 is a plan view of optical semiconductor devices according to Embodiment 1 of the present invention, showing a state after completing a molding step.
Figure 2:
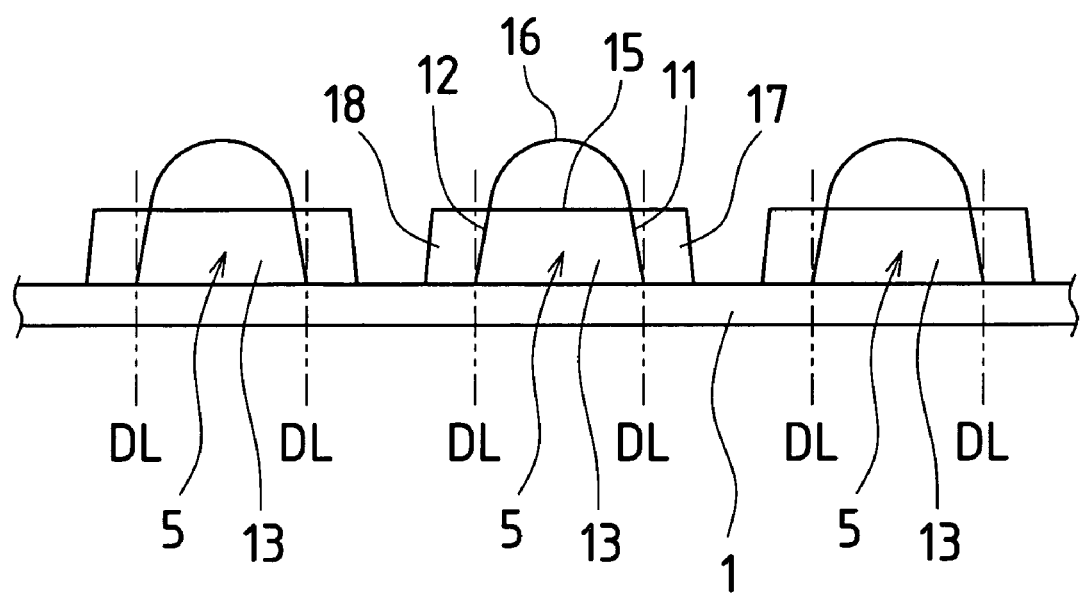
FIG. 2 is a side view as viewed from the direction of X shown with an arrow mark in FIG. 1.

FIG. 1 is a plan view of optical semiconductor devices according to Embodiment 1 of the present invention after completing a molding step. FIG. 2 is a side view as viewed from the direction of X shown with an arrow mark in FIG. 1.

Figure 6:
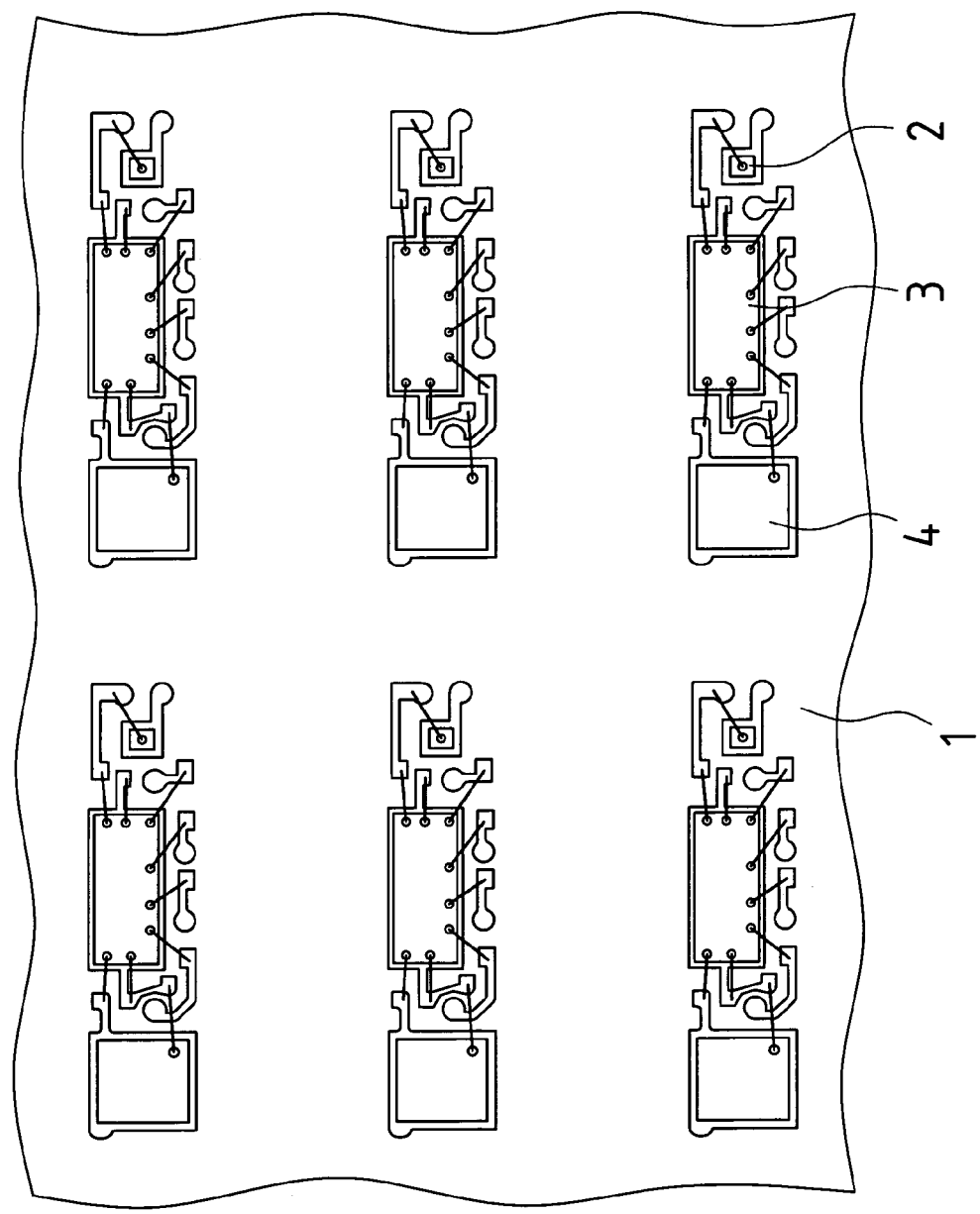
FIG. 6 is a plan view of optical semiconductor devices in a state in which light emitting element chips, IC chips, and light receiving element chips have been mounted on one side of a wiring substrate.
Figure 7:
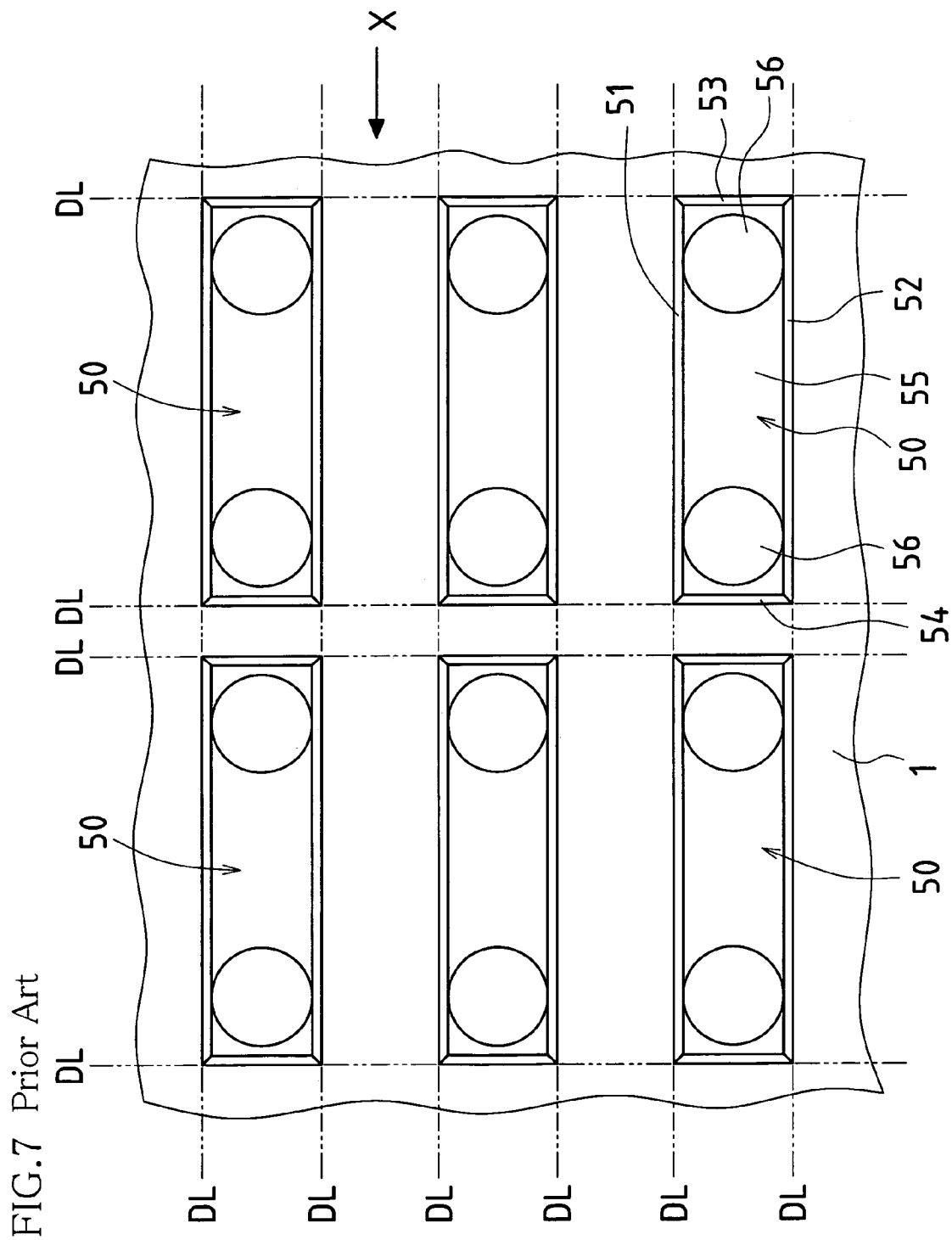
FIG. 7 is a plan view of conventional optical semiconductor devices after completing a molding step, showing a state in which light emitting element chips, IC chips, and light receiving element chips have been resin molded so that resin molded portions are formed.
Figure 8:
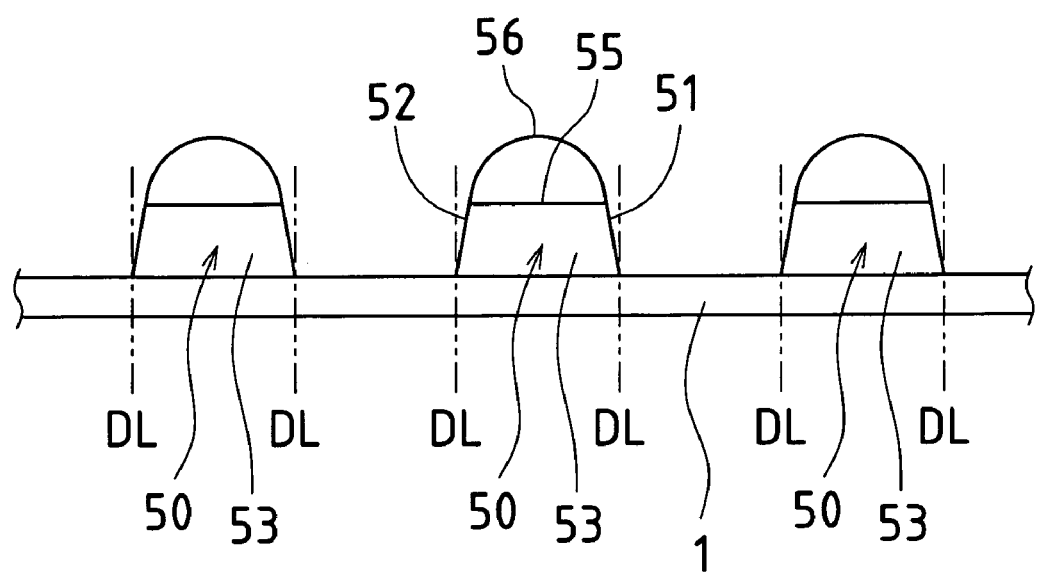
FIG. 8 is a side view as viewed from the direction of X shown with an arrow mark in FIG.7.
Figure 9A:
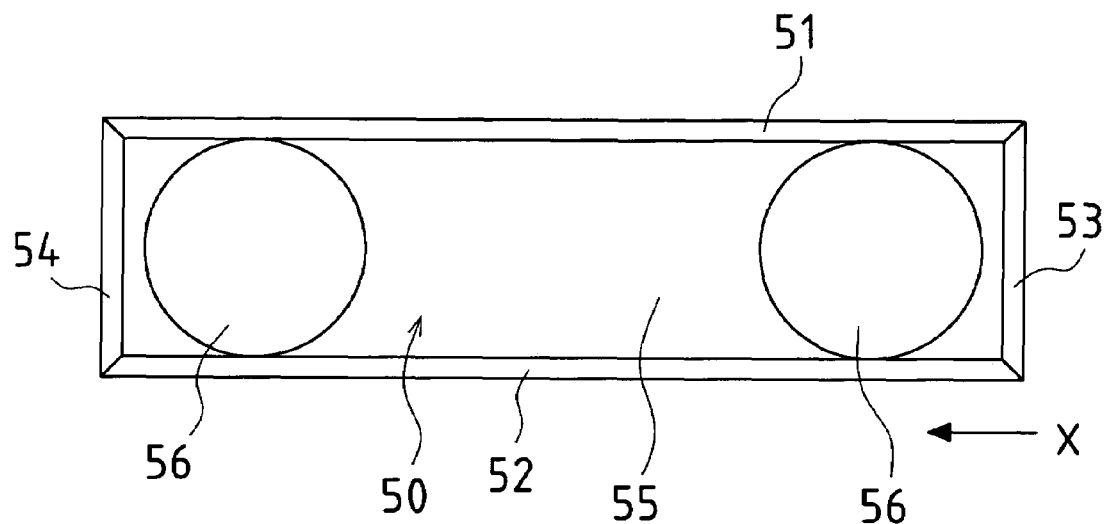
FIG. 9A is an explanation view that describes an individual optical semiconductor device, showing a plan view of the optical semiconductor device as viewed from the side with lens portions.
Figure 9B:
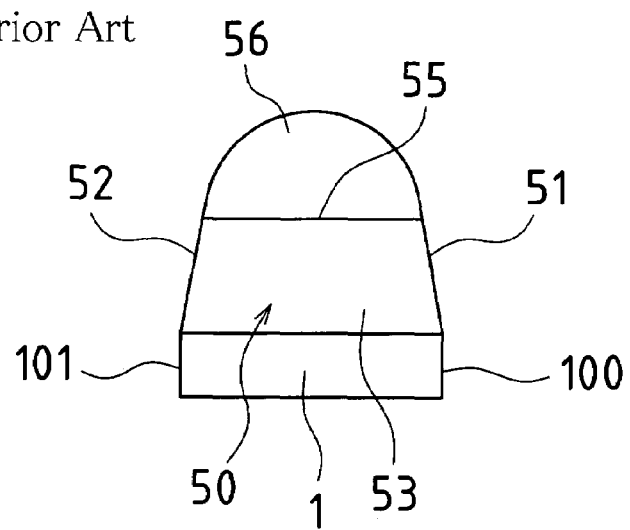
FIG. 9B is an explanation view that describes an individual optical semiconductor device, showing a side view as viewed from the direction of X shown with an arrow mark in FIG. 9A.
Figure 10A:
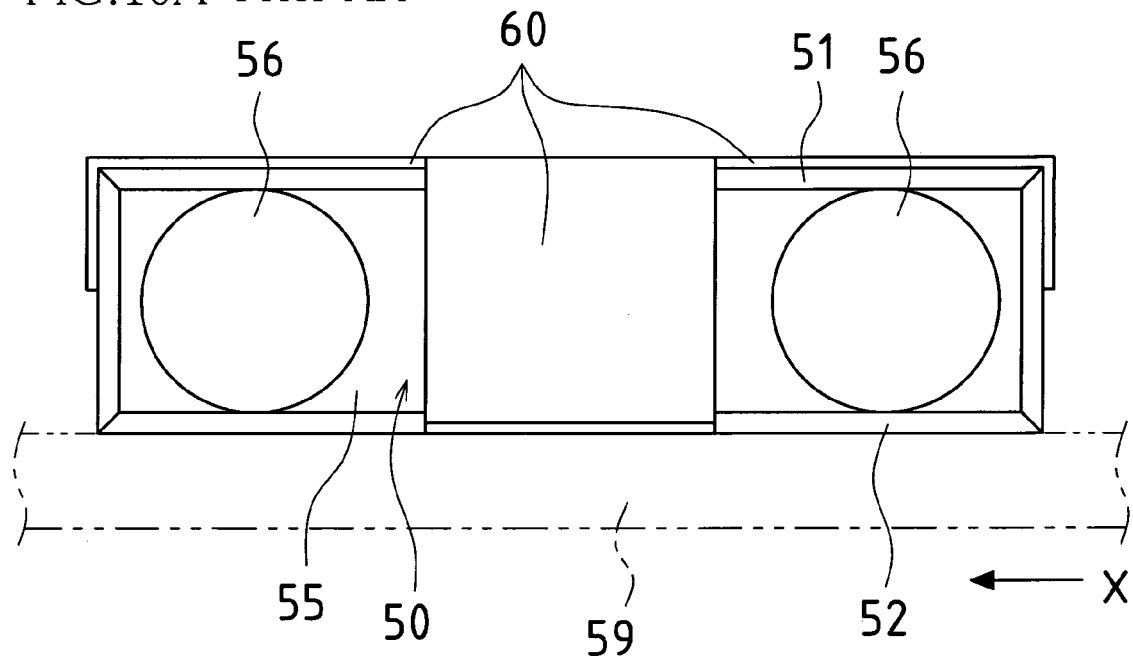
FIG. 10A is an explanation view that describes a state in which an optical semiconductor device is implemented in a device substrate of an electronic device, showing a front view of the optical semiconductor device as viewed from the side with lens portions.
Figure 10B:
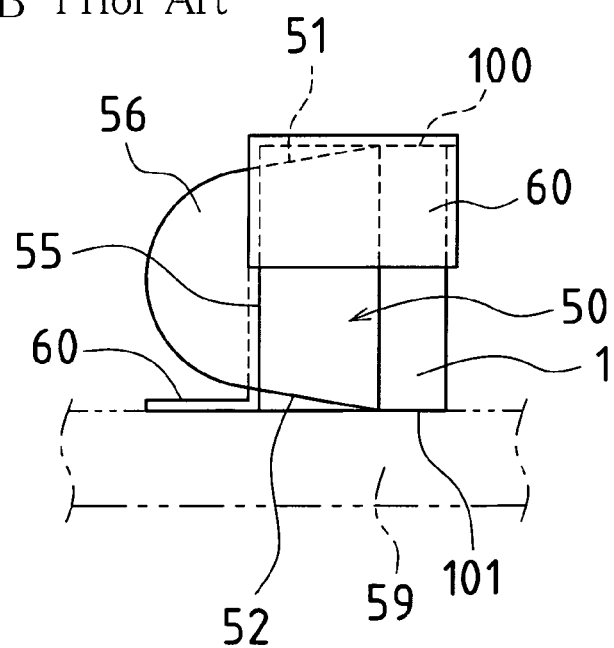
FIG. 10B is an explanation view that describes a state in which an optical semiconductor device is implemented in a device substrate of an electronic device, showing a side view as viewed from the direction of X shown with an arrow mark in FIG. 10A.

The optical semiconductor devices according to this embodiment are processed, prior to a molding step, in the same manner as a mounting step shown in FIG. 6. More specifically, as shown in FIG. 6, light emitting element chips 2, IC chips 3, and light receiving element chips 4 are mounted on a wiring substrate 1 by die bonding the light emitting element chips 2 for light emission, the IC chips 3 as integrated circuits for signal processing, and the light receiving element chips 4 for light receiving onto one side of the wiring substrate using conductive resin, and by wire bonding respective terminals of the light emitting element chips 2, the IC chips 3, and the light receiving element chips 4 to an appropriately formed pattern using a metal wire or the like (a mounting step).

The optical semiconductor devices according to this embodiment are in a state shown in FIG. 1 in which the light emitting element chips 2, the IC chips 3, and the light receiving element chips 4 that have been mounted on one side of the wiring substrate 1 are resin molded so that resin molded portions 5 are formed.

The resin molded portions 5 are formed by performing resin molding using translucent resin with an appropriate mold that consists of rectangular parallelepipeds as a basic shape (molding step). In order to facilitate releasing of the mold after the resin molding, the resin molded portions 5 have first inclination portions 11, second inclination portions 12, third inclination portions 13, and fourth inclination portions 14 formed thereon so that they correspond to the wall surfaces of the rectangular parallelepipeds. The first inclination portions 11 are formed so that they have an appropriate angle relative to the direction perpendicular to the plane surface of the wiring substrate 1, and the second inclination portions 12 are formed opposite to the first inclination portions 11 at an angle, as with the first inclination portions 11, relative to the direction perpendicular to the plane surface of the wiring substrate 1. The third inclination portions 13 and the fourth inclination portions 14 are formed on the other wall surfaces in a manner similar to the first inclination portions 11 and the second inclination portions 12.

The resin molded portions 5 are provided with plane surface portions 15 that have a surface that is in parallel with the plane surface of the wiring substrate 1 and have lens portions 16 and 16 formed on a part thereof so that they correspond to the light emitting element chips 2 and the light receiving element chips 4.

The resin molded portions 5 of the optical semiconductor devices according to the present invention, after completing a molding step, have first protruding molded portions 17 that are protruding from the first inclination portions 11 in the direction crossing the first inclination portions 11 formed on the first inclination portions 11, and second protruding molded portions 18 that are protruding from the second inclination portions 12 in the direction crossing the second inclination portions 12 formed on the second inclination portions 12.

After performing resin molding, the wiring substrate 1 is diced along the dicing lines DL to be separated into individual optical semiconductor devices that have built-in light emitting and light receiving features (separating step). In this separating step, the first protruding molded portions 17 and the second protruding molded portions 18 are diced in the same direction (direction perpendicular relative to the plane surface of the wiring substrate 1: direction perpendicular to the plane surface of the wiring substrate 1) as and at the same time as the wiring substrate 1.

Figure 3A:
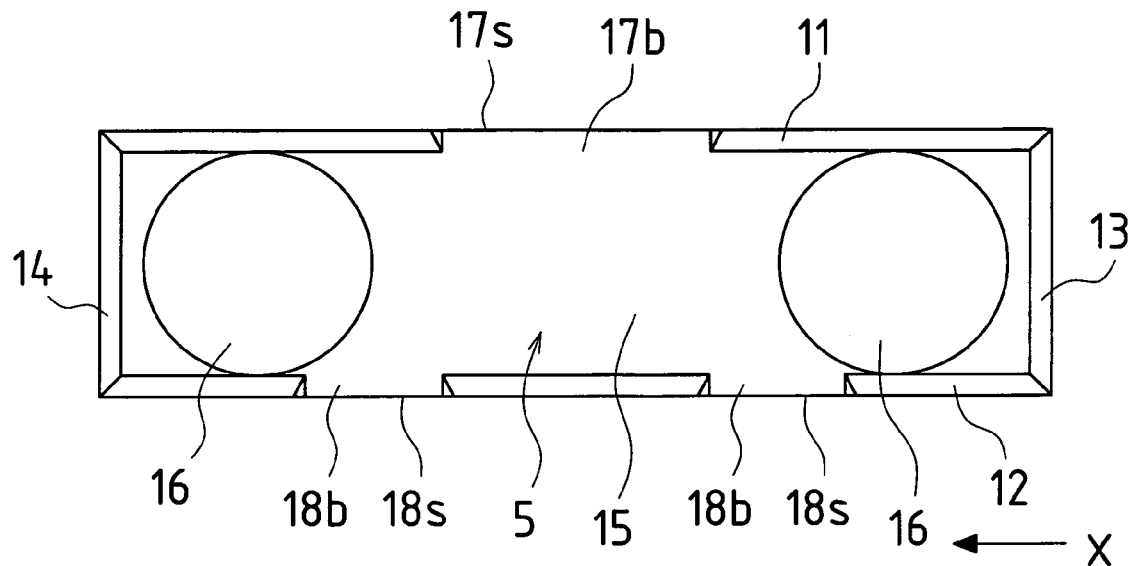
FIG. 3A is an explanation drawing that describes an optical semiconductor device according to Embodiment 1 of the present invention, showing a plan view of an optical semiconductor device as viewed from the side with lens portions.
Figure 3B:
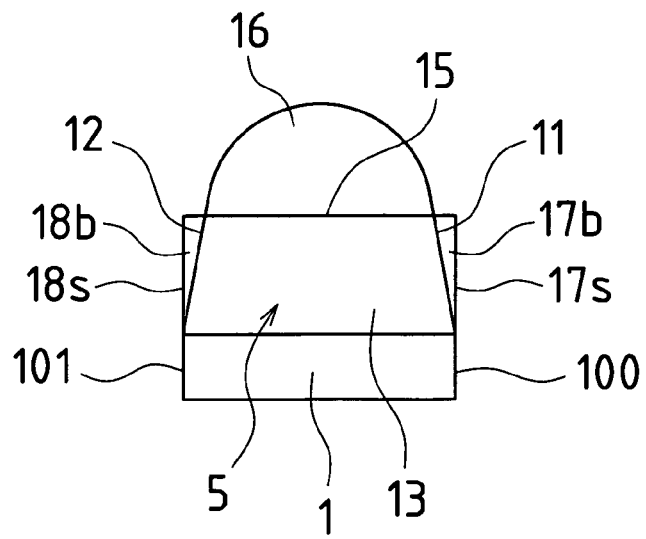
FIG. 3B is an explanation drawing that describes an optical semiconductor device according to Embodiment 1 of the present invention, showing a side view as viewed from the direction of X shown with an arrow mark in FIG. 3A.

FIG. 3A is an explanation drawing that describes the optical semiconductor device according to Embodiment 1 of the present invention, showing a plan view of the optical semiconductor device as viewed from the side with lens portions. FIG. 3B is a side view as viewed from the direction of X shown with an arrow mark in FIG. 3A.

Since the wiring substrate 1 is diced perpendicular to the plane surface along the dicing lines DL, the resulting configuration includes a substrate end portion (attraction surface) 100 adjacent to the first inclination portion 11 in the direction perpendicular to the plane surface of the wiring substrate 1 as well as a substrate end portion (mounting surface) 101 adjacent to the second inclination portion 12 in a direction perpendicular to the plane surface of the wiring substrate 1. In other words, the substrate end portion (attraction surface) 100 corresponds to the first inclination portion 11, and the substrate end portion (mounting surface) 101 corresponds to the second inclination portion 12.

Since the optical semiconductor device according to the present invention is implemented in a device substrate 19 (see FIG. 4) with the lens portions 16 facing in the lateral direction, the substrate end portion 101 on the side with the second inclination portion 12, for example, has a terminal (not shown) for connecting to the outside (for example, to the device substrate 19) led therethrough and placed thereon.

In addition, since the first protruding molded portion 17 and the second protruding molded portion 18 are diced along the dicing lines DL in the same manner as the wiring substrate 1, the first protruding portion 17b and the second protruding portion 18b are formed respectively on the first inclination portion 11 and the second inclination portion 12. Since the first protruding molded portion 17 and the second protruding molded portion 18 are diced in the direction perpendicular to the plane surface of the wiring substrate 1, the first protruding portion 17b and the second protruding portion 18b have flat portions 17s and 18s in the direction perpendicular to the plane surface of the wiring substrate 1.

It is needless to say that formation of either one of the first protruding portion 17b or the second protruding portion 18b only is also acceptable as necessary.

As described above, since the flat portion 17s forms a single flat surface together with the substrate end portion 100 and acts as an attraction surface, the area for attraction with a vacuum nozzle substantially becomes larger. In addition, since the flat portion 18s forms a single flat surface together with the substrate end portion 101 and acts as a mounting surface, the mounting area substantially becomes larger. In this embodiment, the mounting surface is substantially further enlarged by forming a plurality of the flat portions 18s by forming a plurality of the second protruding portions 18b, and connection between the terminal that is led through from the substrate end portion 101 and the pattern on the device substrate 19 can be secured by improving parallelism of the substrate end portion 101 relative to the device substrate 19 by supporting the optical semiconductor device (resin molded portion 5) with a larger area of the device substrate 19.

Accordingly, according to the optical semiconductor device according to the present invention, the optical semiconductor device can be attracted in a stable manner when the optical semiconductor device is implemented in the device substrate 19, which makes positioning to the device substrate 19 reliable. In addition, the optical semiconductor device can be brought into contact with the device substrate 19 in a stable manner, which makes it possible to achieve a stable and highly reliable connection.

Embodiment 2

Figure 4A:
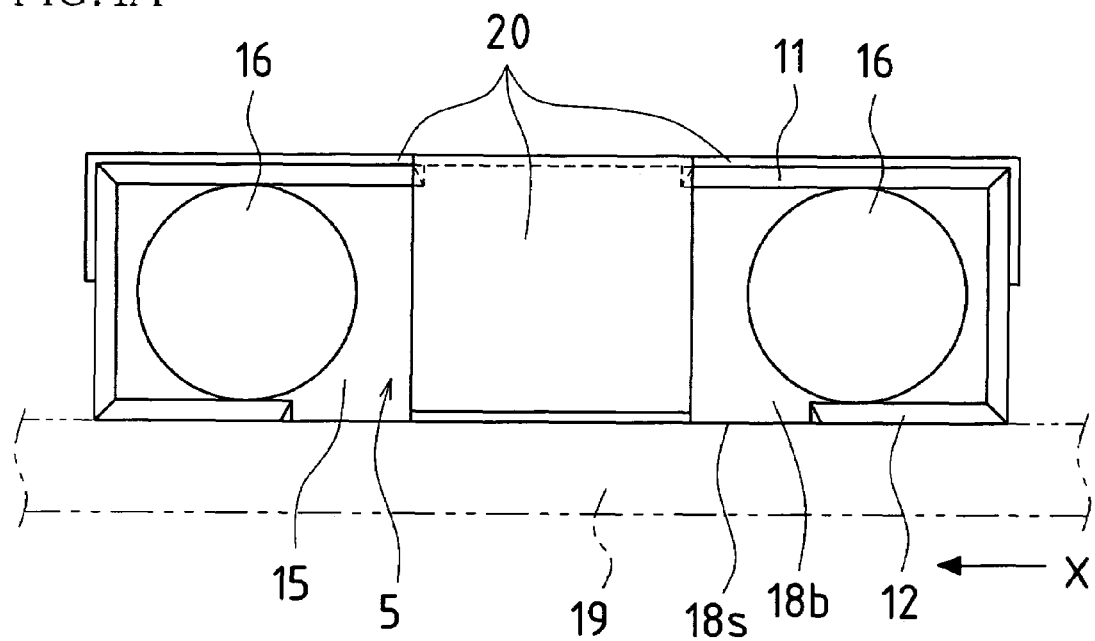
FIG. 4A is an explanation drawing that describes a state in which an optical semiconductor device according to Embodiment 2 of the present invention is implemented in an electronic device, showing a front view of the optical semiconductor device as viewed from the side with lens portions.
Figure 4B:
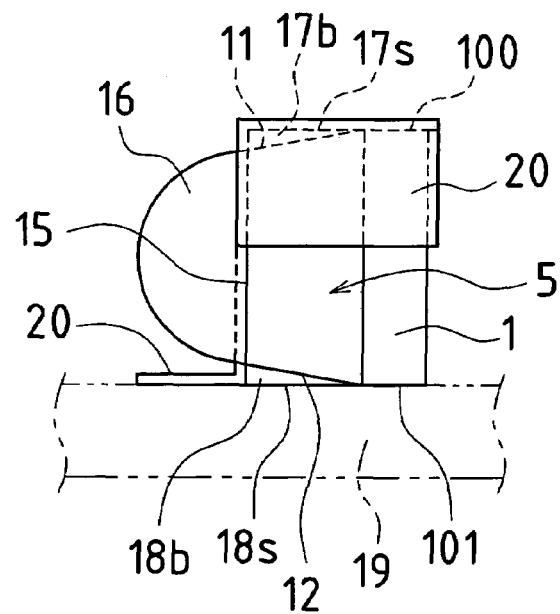
FIG. 4B is an explanation drawing that describes a state in which an optical semiconductor device according to Embodiment 2 of the present invention is implemented in an electronic device, showing a side view as viewed from the direction of X shown with an arrow mark in FIG. 4A.

FIG. 4A is an explanation drawing that describes a state in which an optical semiconductor device according to Embodiment 2 of the present invention is implemented in a device substrate, showing a front view of the optical semiconductor device as viewed from the side with lens portions. FIG. 4B is an explanation drawing that describes a state in which an optical semiconductor device according to Embodiment 2 of the present invention is implemented in a device substrate, showing a side view as viewed from the direction of X shown with an arrow mark in FIG. 4A.

A device substrate 19 of an electronic device has an appropriate wiring pattern (not shown) formed thereon, and the optical semiconductor device is implemented in (mounted on, placed on) the device substrate 19 by connecting a terminal (not shown) that is led through to a substrate end portion 101 to the wiring pattern. More specifically, the substrate end portion 101 is positioned in alignment with and connected to the wiring pattern of the device substrate 19 by attracting a substrate end portion (attraction surface) 100 that is located opposite to the substrate end portion (mounting surface) 101 provided with a terminal, using a vacuum nozzle.

Since a flat portion 17s is formed to correspond to the substrate end portion 100 so that it forms a single plane surface with the substrate end portion 100, the flat portion 17s, in addition to the substrate end portion 100, substantially acts as the area for attraction with a vacuum nozzle. Accordingly, stable attraction and positioning become possible.

In addition, in this embodiment, a shield case 20 is installed to prevent malfunction of an IC chip 3 caused by optical and electromagnetic noises. When the shield case 20 is fixed by adhering it to the substrate end portion 100, it can be brought into contact with (adhered to), in addition to the substrate end portion 100, the flat portion 17s that forms a single plane surface together with the substrate end portion 100. In other words, the substrate end portion 100 and the flat portion 17s act as the contact area for the shield case. Accordingly, since this makes the contact area for the shield case larger and prevents tilting of the shield case 20, it is possible to achieve stable adhesion and a stable and accurate directional pattern.

In addition, when the substrate end portion 101 is brought into contact with the device substrate 19 in parallel, since the flat portion 18s is formed to correspond to the substrate end portion 101 so that a single plane surface is formed with the substrate end portion 101, the flat portion 18s, in addition to the substrate end portion 101, acts as a substantial mounting area.

Accordingly, the mounting area is substantially enlarged, which makes it possible to contact the optical semiconductor device to the device substrate 19 in a stable manner, to achieve a highly reliable connection, and to prevent defective mounting, whereby a highly reliable electronic device can be provided. In addition, an electronic device that has a stable and accurate directional pattern can be provided.

Embodiment 3

Figure 5A:
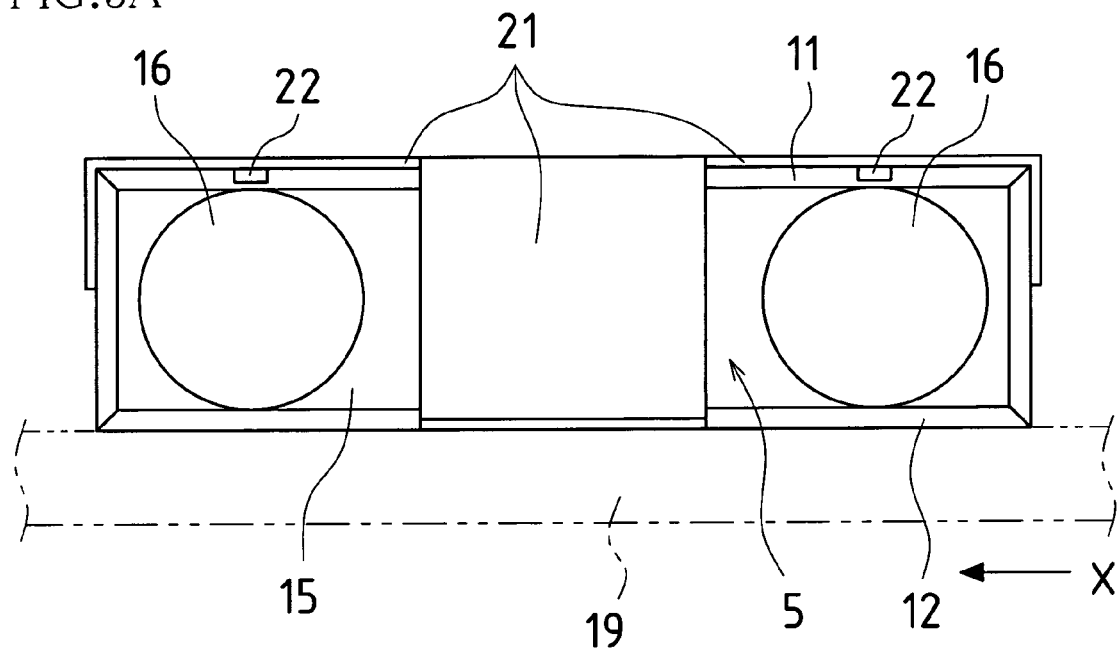
FIG. 5A is an explanation drawing that describes a state in which an optical semiconductor device according to Embodiment 3 of the present invention is implemented in an electronic device, showing a front view of the optical semiconductor device as viewed from the side with lens portions.
Figure 5B:
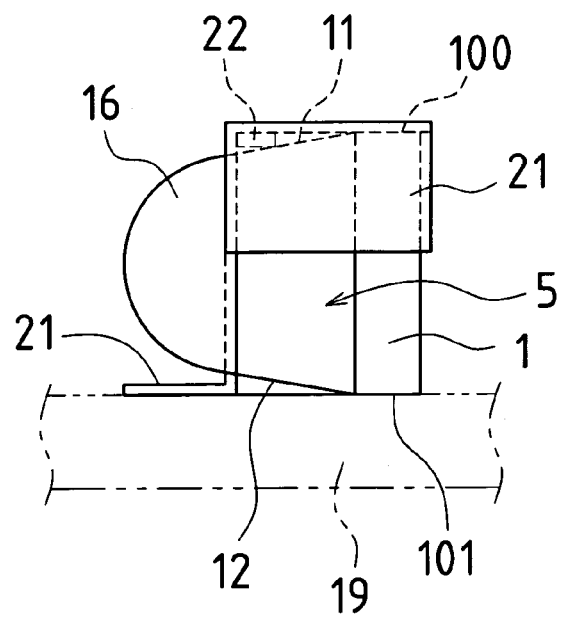
FIG. 5B is an explanation drawing that describes a state in which an optical semiconductor device according to Embodiment 3 of the present invention is implemented in an electronic device, showing a side view as viewed from the direction of X shown with an arrow mark in FIG. 5A.

FIG. 5A is an explanation drawing that describes a state in which an optical semiconductor device according to Embodiment 3 of the present invention is implemented in a device substrate of an electronic device, showing a front view of the optical semiconductor device as viewed from the side with lens portions. FIG. 5B is a side view as viewed from the direction of X shown with an arrow mark in FIG. 5A.

A device substrate 19 of the electronic device has an appropriate pattern (not shown) formed thereon, and the optical semiconductor device is implemented in (mounted on, placed on) the device substrate 19 by connecting a terminal (not shown) that is lead through to a substrate end portion 101 to the wiring pattern. More specifically, the substrate end portion 101 is positioned in alignment with and connected to the wiring pattern of the device substrate 19 by attracting a substrate end portion (attraction surface) 100 that is located opposite to the substrate end portion (mounting surface) 101 provided with a terminal, using a vacuum nozzle.

In this embodiment, similarly to Embodiment 2, a shield case 21 is installed to prevent malfunction of an IC chip 3 caused by optical and electromagnetic noises. The shield case 21 is fixed to the substrate end portion 100 through adhesion. The shield case 21 has a contact portion 22 that comes in contact with a first inclination 11 so that the shield case 21 is securely adhered to the substrate end portion 100.

In other words, with a configuration in which the contact portion 22 that has the height corresponding to the inclination amount of the first inclination portion 11 supports the shield case 21 relative to the first inclination portion 11, it is possible to obtain a stable and accurate directional pattern since tilting of the shield case 21 is prevented and the shield case 21 can be securely adhered to the substrate end portion 100 even when the area of the substrate end portion 100 as the contact area to the shield case is small. Accordingly, since a stable and accurate directional pattern can be obtained, a highly reliable electronic device can be provided.

In this embodiment, a resin molded portion 5 that does not have a first protruding portion 17b (flat portion 17s) and a second protruding portion 18b (flat portion 18s) is described. However, it is needless to say that the shield case 21 (contact portion 22) can also be applied to an optical semiconductor device according to Embodiment 2.

It is needless to say that the shield case 20 described in Embodiment 2 can be provided with the contact portion 22 according to this embodiment. This configuration makes it possible to achieve further stable adhesion of the shield case 20.

The present invention can be embodied and practiced in other different forms without departing from the spirit and essential characteristics thereof. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

What is claimed is:

1. An optical semiconductor device comprising a wiring substrate that has a light emitting element chip, an IC chip, and a light receiving element chip mounted on one of its sides, and a resin molded portion that has a first inclination portion inclined relative to a direction perpendicular to a plane surface of the wiring substrate and a second inclination portion located opposite to the first inclination portion, being formed through the resin molding of the light emitting element chip, the IC chip, and the light receiving element chip, wherein the first inclination portion is provided with a first protruding portion that has a flat portion in the perpendicular direction that, together with a substrate end portion of the wiring substrate, constitutes an attraction surface.

2. The optical semiconductor device according to claim 1, wherein a shield case is brought into contact with the flat portion.

3. The optical semiconductor device according to claim 2, wherein the shield case has a contact portion for contact with the first inclination portion.

4. An electronic device, wherein an optical semiconductor device according to claim 3 is mounted.

5. An electronic device, wherein an optical semiconductor device according to claim 2 is mounted.

6. The optical semiconductor device according to claim 1, comprising a wiring substrate that has a light emitting element chip, an IC chip, and a light receiving element chip mounted on one of its sides, and a resin molded portion that has a first inclination portion inclined relative to a direction perpendicular to a plane surface of the wiring substrate and a second inclination portion located opposite to the first inclination portion, being formed through the resin molding of the light emitting element chip, the IC chip, and the light receiving element chip, wherein the second inclination portion is provided with a second protruding portion that has a flat portion in the perpendicular direction that, together with a substrate end portion of the wiring substrate, constitutes a mounting surface.

7. The optical semiconductor device according to claim 6, wherein a plurality of the second protruding portions are formed.

8. An electronic device, wherein an optical semiconductor device according to claim 7 is mounted.

9. An electronic device, wherein an optical semiconductor device according to claim 6 is mounted.

10. An electronic device, wherein an optical semiconductor device according to claim 1 is mounted.

11. An optical semiconductor device, comprising a wiring substrate that has a light emitting element chip, an IC chip, and a light receiving element chip mounted on one of its sides, and a resin molded portion that has a first inclination portion inclined relative to a direction perpendicular to a plane surface of the wiring substrate and a second inclination portion located opposite to the first inclination portion, being formed through the resin molding of the light emitting element chip, the IC chip, and the light receiving element chip, wherein the second inclination portion is provided with a second protruding portion that has a flat portion in the perpendicular direction that, together with a substrate end portion of the wiring substrate, constitutes a mounting surface.

12. The optical semiconductor device according to claim 11, wherein a plurality of the second protruding portions are formed.

13. An electronic device, wherein an optical semiconductor device according to claim 12 is mounted.

14. An electronic device, wherein an optical semiconductor device according to claim 11 is mounted.

15. An optical semiconductor device comprising a wiring substrate that has a light emitting element chip, an IC chip, and a light receiving element chip mounted on one of its sides, and a resin molded portion that has a first inclination portion inclined relative to a direction perpendicular to a plane surface of the wiring substrate and a second inclination portion located opposite to the first inclination portion, being formed through the resin molding of the light emitting element chip, the IC chip, and the light receiving element chip, wherein a shield case that is adhered to a substrate end portion of the wiring substrate and that has a contact portion for contact with the first inclination portion is provided.

16. An electronic device, wherein an optical semiconductor device according to claim 15 is mounted.

* * * * *